US012625791B2

(12) United States Patent
Kallai et al.

(10) Patent No.: US 12,625,791 B2
(45) Date of Patent: *May 12, 2026

(54) ADJUSTING A PLAYBACK DEVICE

(71) Applicant: Sonos, Inc., Santa Barbara, CA (US)

(72) Inventors: Christopher Kallai, Santa Barbara, CA (US); Michael Darrell Andrew Ericson, Santa Barbara, CA (US)

(73) Assignee: Sonos, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/392,171

(22) Filed: Dec. 21, 2023

(65) Prior Publication Data

US 2024/0411653 A1    Dec. 12, 2024

Related U.S. Application Data

(63) Continuation of application No. 17/822,940, filed on Aug. 29, 2022, now Pat. No. 11,853,184, which is a
(Continued)

(51) Int. Cl.
*G06F 17/00* (2019.01)
*G06F 11/30* (2006.01)
(Continued)

(52) U.S. Cl.
CPC ...... *G06F 11/3006* (2013.01); *G06F 11/3419* (2013.01); *G06F 11/3476* (2013.01);
(Continued)

(58) Field of Classification Search
CPC ............. G06F 11/3006; G06F 11/3419; G06F 11/3476; G06F 11/3495; G06F 2201/81;
(Continued)

(56) References Cited

U.S. PATENT DOCUMENTS 4,995,778 A    2/1991   Bruessel
5,218,710 A    6/1993   Yamaki et al.
(Continued)

FOREIGN PATENT DOCUMENTS

EP    1133896 B1    8/2002
EP    1389853 A1    2/2004
(Continued)

OTHER PUBLICATIONS

Advisory Action mailed on Aug. 13, 2021, issued in connection with U.S. Appl. No. 17/129,462, filed Dec. 21, 2020, 5 pages.
(Continued)

*Primary Examiner* — Paul C Mccord
(74) *Attorney, Agent, or Firm* — Akerman LLP

(57) ABSTRACT

Certain embodiments provide methods and systems for managing a sound profile. An example playback device includes a network interface and a non-transitory computer readable storage medium having stored therein instructions executable by the processor. When executed by the processor, the instructions are to configure the playback device to receive, via the network interface over a local area network (LAN) from a controller device, an instruction. The example playback device is to obtain, based on the instruction, via the network interface from a location outside of the LAN, data comprising a sound profile. The example playback device is to update one or more parameters at the playback device based on the sound profile. The example playback device is to play back an audio signal according to the sound profile.

20 Claims, 7 Drawing Sheets

Related U.S. Application Data continuation of application No. 15/676,655, filed on Aug. 14, 2017, now Pat. No. 11,429,502, which is a continuation of application No. 14/552,049, filed on Nov. 24, 2014, now Pat. No. 9,734,243, which is a continuation of application No. 13/272,833, filed on Oct. 13, 2011, now Pat. No. 8,923,997.

(60) Provisional application No. 61/392,918, filed on Oct. 13, 2010.

(51) Int. Cl.

| | |
|---|---|
| *G06F 11/34* | (2006.01) |
| *G06F 16/00* | (2019.01) |
| *G06F 16/60* | (2019.01) |
| *H03G 5/00* | (2006.01) |
| *H03G 5/02* | (2006.01) |
| *H03G 5/16* | (2006.01) |

(52) U.S. Cl.
CPC .......... *G06F 11/3495* (2013.01); *G06F 16/00* (2019.01); *G06F 16/60* (2019.01); *H03G 5/005* (2013.01); *H03G 5/025* (2013.01); *H03G 5/165* (2013.01); *G06F 2201/81* (2013.01); *G06F 2201/875* (2013.01)

(58) Field of Classification Search
CPC .............. G06F 2201/875; H03G 5/005; H03G 5/025; H03G 5/165
USPC ................................................ 714/39; 700/94
See application file for complete search history.

(56) References Cited

U.S. PATENT DOCUMENTS

| | | | |
|---|---|---|---|
| 5,440,644 A | 8/1995 | Farinelli et al. | |
| 5,553,147 A | 9/1996 | Pineau | |
| 5,668,884 A | 9/1997 | Clair, Jr. et al. | |
| 5,673,323 A | 9/1997 | Schotz et al. | |
| 5,761,320 A | 6/1998 | Farinelli et al. | |
| 5,910,991 A | 6/1999 | Farrar | |
| 5,923,902 A | 7/1999 | Inagaki | |
| 5,946,343 A | 8/1999 | Schotz et al. | |
| 6,032,202 A | 2/2000 | Lea et al. | |
| 6,256,554 B1 | 7/2001 | DiLorenzo | |
| 6,404,811 B1 | 6/2002 | Cvetko et al. | |
| 6,469,633 B1 | 10/2002 | Wachter | |
| 6,522,886 B1 | 2/2003 | Youngs et al. | |
| 6,611,537 B1 | 8/2003 | Edens et al. | |
| 6,631,410 B1 | 10/2003 | Kowalski et al. | |
| 6,674,864 B1 | 1/2004 | Kitamura | |
| 6,704,421 B1 | 3/2004 | Kitamura | |
| 6,757,517 B2 | 6/2004 | Chang | |
| 6,778,869 B2 | 8/2004 | Champion | |
| 6,916,980 B2 | 7/2005 | Ishida et al. | |
| 6,931,134 B1 | 8/2005 | Waller, Jr. et al. | |
| 7,072,477 B1 | 7/2006 | Kincaid | |
| 7,130,608 B2 | 10/2006 | Hollstrom et al. | |
| 7,130,616 B2 | 10/2006 | Janik | |
| 7,143,939 B2 | 12/2006 | Henzerling | |
| 7,171,010 B2 | 1/2007 | Martin et al. | |
| 7,236,773 B2 | 6/2007 | Thomas | |
| 7,251,533 B2 | 7/2007 | Yoon et al. | |
| 7,295,548 B2 | 11/2007 | Blank et al. | |
| 7,383,036 B2 | 6/2008 | Kang et al. | |
| 7,394,480 B2 | 7/2008 | Song | |
| 7,483,538 B2 | 1/2009 | McCarty et al. | |
| 7,490,044 B2 | 2/2009 | Kulkarni | |
| 7,519,188 B2 | 4/2009 | Berardi et al. | |
| 7,539,551 B2 | 5/2009 | Komura et al. | |
| 7,571,014 B1 * | 8/2009 | Lambourne ............. | G06F 3/165 |
| | | | 700/94 |
| 7,607,091 B2 | 10/2009 | Song et al. | |
| 7,630,500 B1 | 12/2009 | Beckman et al. | |
| 7,630,501 B2 | 12/2009 | Blank et al. | |
| 7,643,894 B2 | 1/2010 | Braithwaite et al. | |
| 7,657,910 B1 | 2/2010 | McAulay et al. | |
| 7,689,305 B2 | 3/2010 | Kreifeldt et al. | |
| 7,792,311 B1 | 9/2010 | Holmgren et al. | |
| 7,853,341 B2 | 12/2010 | McCarty et al. | |
| 7,987,294 B2 | 7/2011 | Bryce et al. | |
| 8,014,423 B2 | 9/2011 | Thaler et al. | |
| 8,045,952 B2 | 10/2011 | Qureshey et al. | |
| 8,054,987 B2 | 11/2011 | Seydoux | |
| 8,063,698 B2 | 11/2011 | Howard | |
| 8,103,009 B2 | 1/2012 | McCarty et al. | |
| 8,131,389 B1 | 3/2012 | Hardwick et al. | |
| 8,139,774 B2 | 3/2012 | Berardi et al. | |
| 8,160,281 B2 | 4/2012 | Kim et al. | |
| 8,175,292 B2 | 5/2012 | Aylward et al. | |
| 8,229,125 B2 | 7/2012 | Short | |
| 8,233,632 B1 | 7/2012 | Macdonald et al. | |
| 8,234,395 B2 | 7/2012 | Millington | |
| 8,238,578 B2 | 8/2012 | Aylward | |
| 8,243,961 B1 | 8/2012 | Morrill | |
| 8,265,310 B2 | 9/2012 | Berardi et al. | |
| 8,290,185 B2 | 10/2012 | Kim | |
| 8,306,235 B2 | 11/2012 | Mahowald | |
| 8,325,935 B2 | 12/2012 | Rutschman | |
| 8,331,585 B2 | 12/2012 | Hagen et al. | |
| 8,391,501 B2 | 3/2013 | Khawand et al. | |
| 8,423,893 B2 | 4/2013 | Ramsay et al. | |
| 8,452,020 B2 | 5/2013 | Gregg et al. | |
| 8,483,853 B1 | 7/2013 | Lambourne | |
| 8,521,316 B2 | 8/2013 | Louboutin | |
| 8,577,045 B2 | 11/2013 | Gibbs | |
| 8,577,048 B2 | 11/2013 | Chaikin et al. | |
| 8,600,075 B2 | 12/2013 | Lim | |
| 8,620,006 B2 | 12/2013 | Berardi et al. | |
| 8,831,761 B2 | 9/2014 | Kemp et al. | |
| 8,843,224 B2 | 9/2014 | Holmgren et al. | |
| 8,849,434 B1 | 9/2014 | Pontual et al. | |
| 8,855,319 B2 | 10/2014 | Liu et al. | |
| 8,879,761 B2 | 11/2014 | Johnson et al. | |
| 8,914,559 B2 | 12/2014 | Kalayjian et al. | |
| 8,934,647 B2 | 1/2015 | Joyce et al. | |
| 8,934,655 B2 | 1/2015 | Breen et al. | |
| 8,965,546 B2 | 2/2015 | Visser et al. | |
| 8,977,974 B2 | 3/2015 | Kraut | |
| 8,984,442 B2 | 3/2015 | Pirnack et al. | |
| 9,020,153 B2 | 4/2015 | Britt, Jr. | |
| 9,042,556 B2 | 5/2015 | Kallai et al. | |
| 2001/0042107 A1 | 11/2001 | Palm | |
| 2002/0022453 A1 | 2/2002 | Balog et al. | |
| 2002/0026442 A1 | 2/2002 | Lipscomb et al. | |
| 2002/0072816 A1 | 6/2002 | Shdema et al. | |
| 2002/0078161 A1 | 6/2002 | Cheng | |
| 2002/0124097 A1 | 9/2002 | Isely et al. | |
| 2002/0159607 A1 | 10/2002 | Ford et al. | |
| 2003/0002689 A1 | 1/2003 | Folio | |
| 2003/0157951 A1 | 8/2003 | Hasty, Jr. | |
| 2003/0161479 A1 | 8/2003 | Yang et al. | |
| 2003/0210796 A1 | 11/2003 | Mccarty et al. | |
| 2003/0215097 A1 * | 11/2003 | Crutchfield, Jr. .... | H04R 29/001 |
| | | | 381/61 |
| 2004/0015252 A1 | 1/2004 | Aiso et al. | |
| 2004/0024478 A1 | 2/2004 | Hans et al. | |
| 2004/0234088 A1 | 11/2004 | McCarty et al. | |
| 2004/0237750 A1 | 12/2004 | Smith et al. | |
| 2005/0147261 A1 | 7/2005 | Yeh | |
| 2006/0149402 A1 | 7/2006 | Chung | |
| 2006/0173972 A1 | 8/2006 | Jung et al. | |
| 2006/0205349 A1 | 9/2006 | Passier et al. | |
| 2006/0222185 A1 | 10/2006 | Dyer et al. | |
| 2006/0229752 A1 | 10/2006 | Chung | |
| 2007/0003067 A1 | 1/2007 | Gierl et al. | |
| 2007/0025559 A1 | 2/2007 | Mihelich et al. | |
| 2007/0142944 A1 | 6/2007 | Goldberg et al. | |
| 2008/0002839 A1 | 1/2008 | Eng | |
| 2008/0025535 A1 | 1/2008 | Rajapakse | |
| 2008/0045140 A1 | 2/2008 | Korhonen | |
| 2008/0077261 A1 | 3/2008 | Baudino et al. | |

(56) References Cited

U.S. PATENT DOCUMENTS

| | | | |
|---|---|---|---|
| 2008/0092204 A1 | 4/2008 | Bryce et al. | |
| 2008/0144864 A1 | 6/2008 | Huon et al. | |
| 2008/0152165 A1 | 6/2008 | Zacchi | |
| 2008/0162668 A1 | 7/2008 | Miller | |
| 2008/0175411 A1 | 7/2008 | Greve | |
| 2009/0024662 A1 | 1/2009 | Park et al. | |
| 2009/0047993 A1* | 2/2009 | Vasa | G11B 27/34 |
| | | | 381/103 |
| 2009/0220095 A1 | 9/2009 | Oh et al. | |
| 2009/0274309 A1 | 11/2009 | Pedersen | |
| 2010/0052843 A1 | 3/2010 | Cannistraro | |
| 2010/0142735 A1 | 6/2010 | Yoon et al. | |
| 2010/0166222 A1 | 7/2010 | Bongiovi | |
| 2010/0284389 A1 | 11/2010 | Ramsay et al. | |
| 2010/0299639 A1 | 11/2010 | Ramsay et al. | |
| 2011/0044476 A1 | 2/2011 | Burlingame et al. | |
| 2011/0170710 A1 | 7/2011 | Son | |
| 2011/0299696 A1 | 12/2011 | Holmgren et al. | |
| 2012/0051558 A1 | 3/2012 | Kim et al. | |
| 2012/0096125 A1 | 4/2012 | Kallai et al. | |
| 2012/0127831 A1 | 5/2012 | Gicklhorn et al. | |
| 2012/0263325 A1 | 10/2012 | Freeman et al. | |
| 2013/0010970 A1 | 1/2013 | Hegarty et al. | |
| 2013/0028443 A1 | 1/2013 | Pance et al. | |
| 2013/0259254 A1 | 10/2013 | Xiang et al. | |
| 2014/0016784 A1 | 1/2014 | Sen et al. | |
| 2014/0016786 A1 | 1/2014 | Sen | |
| 2014/0016802 A1 | 1/2014 | Sen | |
| 2014/0023196 A1 | 1/2014 | Xiang et al. | |
| 2014/0112481 A1 | 4/2014 | Li et al. | |
| 2014/0219456 A1 | 8/2014 | Morrell et al. | |
| 2014/0226823 A1 | 8/2014 | Sen et al. | |
| 2014/0233755 A1 | 8/2014 | Kim et al. | |
| 2014/0294200 A1 | 10/2014 | Baumgarte et al. | |
| 2014/0355768 A1 | 12/2014 | Sen et al. | |
| 2014/0355794 A1 | 12/2014 | Morrell et al. | |
| 2015/0063610 A1 | 3/2015 | Mossner | |
| 2015/0146886 A1 | 5/2015 | Baumgarte | |
| 2015/0201274 A1 | 7/2015 | Ellner et al. | |
| 2015/0281866 A1 | 10/2015 | Williams et al. | |

FOREIGN PATENT DOCUMENTS

| | | | |
|---|---|---|---|
| EP | 1825713 B1 | 10/2012 | |
| EP | 2860992 A1 | 4/2015 | |
| WO | 200153994 | 7/2001 | |
| WO | 2003093950 A2 | 11/2003 | |
| WO | 2013012582 | 1/2013 | |
| WO | 2015024881 A1 | 2/2015 | |

OTHER PUBLICATIONS

AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Final Office Action mailed on Oct. 3, 2019, issued in connection with U.S. Appl. No. 15/676,655, filed Aug. 14, 2017, 15 pages.
Final Office Action mailed on Dec. 11, 2020, issued in connection with U.S. Appl. No. 15/676,655, filed Aug. 14, 2017, 17 pages.
Final Office Action mailed on Jun. 4, 2021, issued in connection with U.S. Appl. No. 17/129,462, filed Dec. 21, 2020, 18 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Nilsson, M., "ID3 Tag Version 2," Mar. 26, 1998, 28 pages.
Non-Final Office Action mailed on Oct. 10, 2018, issued in connection with U.S. Appl. No. 15/676,655, filed Aug. 14, 2017, 15 pages.
Non-Final Office Action mailed on Oct. 12, 2021, issued in connection with U.S. Appl. No. 17/129,462, filed Dec. 21, 2020, 20 pages.
Non-Final Office Action mailed on Mar. 15, 2016, issued in connection with U.S. Appl. No. 14/552,049, filed Nov. 24, 2014, 13 pages.
Non-Final Office Action mailed on Mar. 22, 2023, issued in connection with U.S. Appl. No. 17/822,940, filed Aug. 29, 2022, 17 pages.
Non-Final Office Action mailed on Aug. 30, 2021, issued in connection with U.S. Appl. No. 15/676,655, filed Aug. 14, 2017, 20 pages.
Non-Final Office Action mailed on Jul. 7, 2020, issued in connection with U.S. Appl. No. 15/676,655, filed Aug. 14, 2017, 18 pages.
Non-Final Office Action mailed on Feb. 8, 2021, issued in connection with U.S. Appl. No. 17/129,462, filed Dec. 21, 2020, 17 pages.
Notice of Allowance mailed on Jun. 9, 2017, issued in connection with U.S. Appl. No. 14/552,049, filed Nov. 24, 2014, 5 pages.
Notice of Allowance mailed on Feb. 11, 2022, issued in connection with U.S. Appl. No. 17/129,462, filed Dec. 21, 2020, 8 pages.
Notice of Allowance mailed on Apr. 12, 2022, issued in connection with U.S. Appl. No. 15/676,655, filed Aug. 14, 2017, 7 pages.
Notice of Allowance mailed on Sep. 13, 2016, issued in connection with U.S. Appl. No. 14/552,049, filed Nov. 24, 2014, 8 pages.
Notice of Allowance mailed on Nov. 21, 2014, issued in connection with U.S. Appl. No. 13/272,833, filed Oct. 13, 2011, 7 pages.
Notice of Allowance mailed on Aug. 7, 2023, issued in connection with U.S. Appl. No. 17/822,940, filed Aug. 29, 2022, 9 pages.
Palm, Inc., "Handbook for the Palm VII Handheld," May 2000, 311 pages.
Presentations at WinHEC 2000, May 2000, 138 pages.
True Audio. About WinSpeakerz, Loudspeaker Design Software for Windows 95/98/NT/2000/XP, Jan. 11, 2008, 7 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 32 manual: copyright 2001.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

240

Scroll wheel 250

252

254

248

246

244

242

262

264

268

266

Alternative: Smart Phone
Desktop computer
Portable computer (e.g.,laptop, tablet)

270

282

284

Memory

Application Module

Micro Controller

276

Screen

272

Screen Driver

274

Input Interface

278

RF Interface (Network Interface)

280

500

Start — 505

Save speaker profile — 510

Share speaker profile — 515

Read profile — 520

Configure device based on profile — 525 saved ? — 530

No

Yes

Save the profile for the playback device — 535 end — 540

ADJUSTING A PLAYBACK DEVICE

CROSS-REFERENCE TO RELATED APPLICATIONS

This application is a continuation of U.S. application Ser. No. 17/822,940, titled "Adjusting a Playback Device," filed on Aug. 29, 2022, and currently pending; U.S. application Ser. No. 17/822,940 is a continuation of U.S. application Ser. No. 15/676,655, titled "Adjusting a Playback Device," filed on Aug. 14, 2017, and issued Aug. 30, 2022, as U.S. Pat. No. 11,429,502; U.S. application Ser. No. 15/676,655 is a continuation of U.S. application Ser. No. 14/552,049, titled "Adjusting a Playback Device," filed Nov. 24, 2014, and issued on Aug. 15, 2017, as U.S. Pat. No. 9,734,243; U.S. application Ser. No. 14/552,049 is a continuation of U.S. application Ser. No. 13/272,833, titled "Method and Apparatus for Adjusting a Speaker System," filed Oct. 13, 2011, and issued Dec. 30, 2014, as U.S. Pat. No. 8,923,997; U.S. application Ser. No. 13/272,833 claims priority to U.S. Prov. App. 61/392,918, titled "Method and Apparatus for Adjusting a Loudspeaker," filed Oct. 13, 2010. The entire contents of the Ser. Nos. 17/822,940; 15/676,655; 14/552,049; 13/272,833; and 61/392,918 applications are incorporated herein by reference.

FIELD OF THE INVENTION

The present invention is related to the area of audio devices, and more specifically related to techniques for adjusting a speaker system or loudspeaker via a network.

BACKGROUND

Designing and fine tuning of loudspeakers are often a laborious process. In a typical process, certain electrical components have to be repeatedly changed or adjusted to generate a new equalization or new firmware has to be upgraded on some modern products. Typically during development, a loudspeaker is placed inside a large anechoic chamber where acoustic measurements are gradually taken. After each measurement, the product is removed from the chamber and brought out to be adjusted and then setup again to be re-measured. The process often takes days or weeks until the final sound of the loudspeaker is determined.

BRIEF DESCRIPTION OF THE DRAWINGS

Certain embodiments of the present invention will be readily understood by the following detailed description in conjunction with the accompanying drawings, wherein like reference numerals designate like structural elements, and in which.

Figure 1:
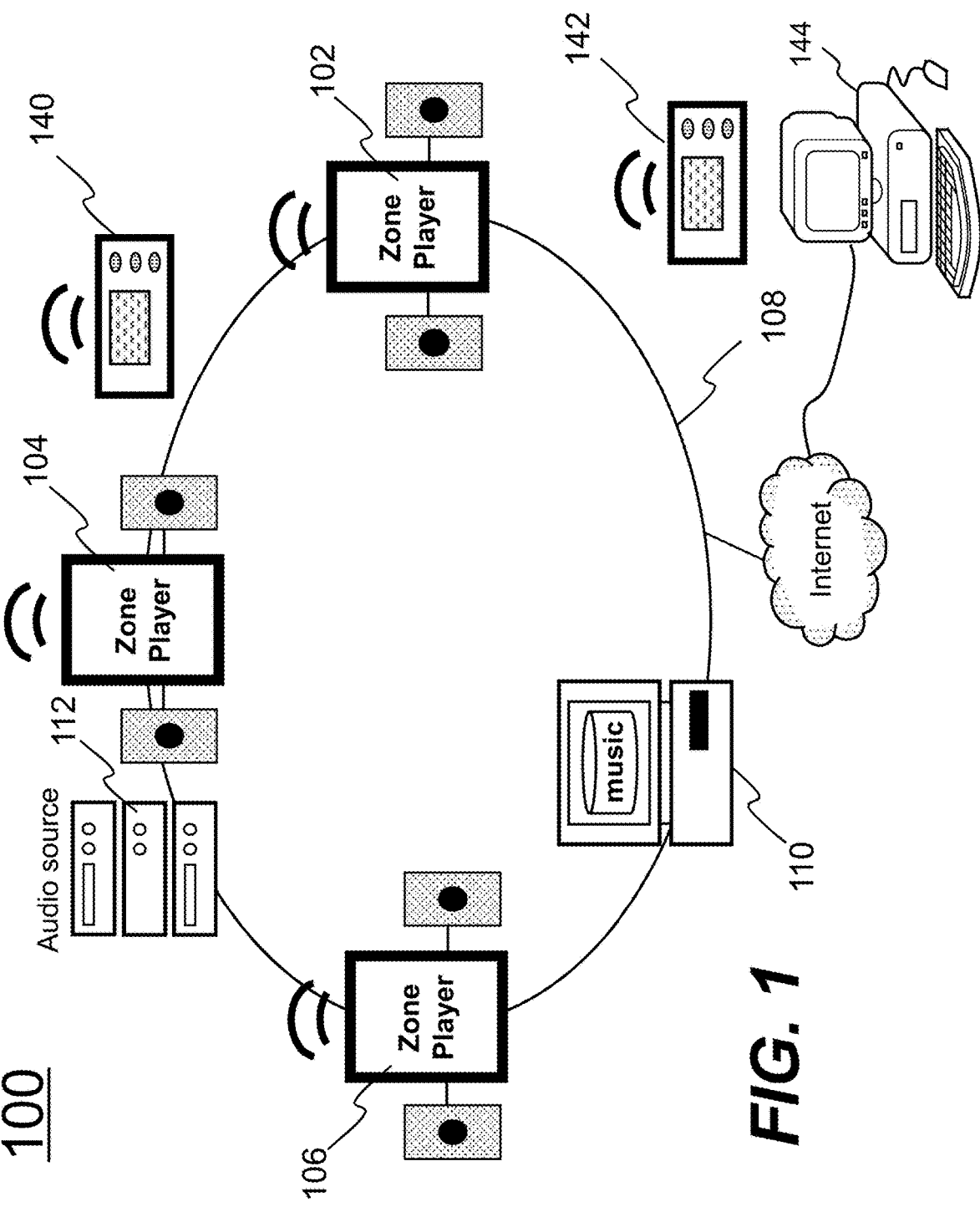
FIG. 1 shows an example configuration in which certain embodiments may be practiced.

Certain embodiments will be better understood when read in conjunction with the provided drawings, which illustrate examples. It should be understood, however, that the embodiments are not limited to the arrangements and instrumentality shown in the attached drawings.

DETAILED DESCRIPTION OF CERTAIN EMBODIMENTS

The detailed description of certain embodiments is presented largely in terms of procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Reference herein to "one embodiment" or "an embodiment" means that a particular feature, structure, or characteristic described in connection with the embodiment can be included in at least one embodiment. The appearances of the phrase "in one embodiment" or "in an embodiment" in various places in the specification are not necessarily all referring to the same embodiment, nor are separate or alternative embodiments mutually exclusive of other embodiments. Further, the order of blocks in process flowcharts or diagrams representing one or more embodiments do not inherently indicate any particular order or imply any limitations.

Certain embodiments provide techniques for adjusting loudspeakers (referred to herein interchangeably as speakers) via the Internet. The adjustment includes at least tuning, configuration and creation of customized equalizers (EQs). In one embodiment, a graphic interface is provided to tune a loudspeaker, and allows a user to do quick iteration on the final "sound" of the loudspeaker. In another embodiment, a set of settings can be remotely adjusted or shared with another speaker system.

In an example application, when loudspeakers are placed in a listening environment, a customer home or a remote location, the loudspeakers sound can be adjusted remotely by a professional or an experienced user through the Internet. This allows a listener to be able to select his/her favorite sound from a variety of options, and sometimes share his/her sound with another listener remotely located.

In certain embodiments, the loudspeaker incorporates a method to connect the speaker to the network via a connection, such as Ethernet or wireless 802.11n. For example, the Internet Protocol (IP) address of the loudspeaker is typed into a computer, and the computer screen displays a loudspeaker parameter configuration layout. In certain embodiments, a configuration profile can be created to specify configuration values for one or more loudspeaker parameters including tweeter, midrange, woofer, etc. A type, frequency, gain, quality factor, etc., can be set for each parameter.

Once "logged in" to the loudspeaker, the current settings are loaded into a webpage and/or other presentation interface, for example. A user can then adjust any/all of the items in each area. Once the values are entered into each area, the values are updated in "real-time" (or substantially real-time accounting for some system processing, storage, and/or transmission delay, for example) on the loud speaker.

In certain embodiments, the configuration webpage can be designed specifically for the loudspeaker under development. For example, if a loudspeaker includes five transducers, five sections can be quickly created such that the webpage has the current number of "tuneable" sections.

Thus, certain embodiments provide for speaker configuration, configuration profile creation, and configuration profile storage. The configuration profile can be referred from one user to another, from one speaker to another, and so on. A referred profile can be accessed and implemented at one or more connected speakers to configure the speakers and/or other playback devices for playback output, for example.

BRIEF DESCRIPTION

Certain embodiments provide a method for managing a sound profile. The example method includes accessing a playback device on a network. The example method includes displaying a graphic interface to allow a user to adjust the sound profile, wherein the sound profile includes a plurality of parameters for user adjustment. The example method includes saving the sound profile. The example method includes processing an audio signal at the playback device according to the sound profile, wherein user adjustments to the sound profile are used to configure the playback device to process the audio signal upon saving the sound profile.

Certain embodiments provide a computer readable medium including a set of instructions for execution by a computer device, the set of instructions, when executed, implementing a method for managing a sound profile. The example method includes accessing a playback device on a network. The example method includes displaying a graphic interface to allow a user to adjust the sound profile, wherein the sound profile includes a plurality of parameters for user adjustment. The example method includes saving the sound profile. The example method includes processing an audio signal at the playback device according to the sound profile, wherein user adjustments to the sound profile are used to configure the playback device to process the audio signal upon saving the sound profile.

Certain embodiments provide a speaker configuration system. The example system includes a computing device. The example computing device includes an application module to facilitate control functions for a playback device including access to a sound profile to configure the playback device. The example computing device includes an interface to allow a user to adjust the sound profile, wherein the sound profile includes a plurality of playback device parameters for user adjustment. The example computing device is to save the sound profile and facilitate application of the sound profile to the playback device to configure output of multimedia content via the playback device.

EXAMPLES

Referring now to the drawings, in which like numerals refer to like parts throughout the several views. FIG. 1 shows an example configuration 100 in which the present invention may be practiced. The configuration may represent, but not be limited to, a part of a residential home, a business building or a complex with multiple zones. There are a number of multimedia players of which three examples 102, 104 and 106 are shown as audio devices. Each of the audio devices may be installed or provided in one particular area or zone and hence referred to as a zone player herein.

As used herein, unless explicitly stated otherwise, a track and an audio source are used interchangeably, an audio source or audio sources are in digital format and can be transported or streamed across a data network. To facilitate the understanding of the present invention, it is assumed that the configuration 100 represents a home. Thus, the zone players 102 and 104 may be located in two of the bedrooms respectively while the zone player 106 may be installed in a living room. All of the zone players 102, 104 and 106 are coupled directly or indirectly to a data network 108 that is also referred to as ad hoc network formed by a plurality of zone players and one or more controllers. In addition, a computing device 110 is shown to be coupled on the network 108. In reality, any other devices such as a home gateway device, a storage device, or an MP3 player may be coupled to the network 108 as well.

The network 108 may be a wired network, a wireless network or a combination of both. In one example, all devices including the zone players 102, 104 and 106 are wirelessly coupled to the network 108 (e.g., based on an industry standard such as IEEE 802.11). In yet another example, all devices including the zone players 102, 104 and 106 are part of a local area network that communicates with a wide area network (e.g., the Internet).

All devices on the network 108 may be configured to download and store audio sources or receive streaming audio sources. For example, the computing device 110 can download audio sources from the Internet and store the downloaded sources locally for sharing with other devices on the Internet or the network 108. The zone player 106 can be configured to receive streaming audio source and share the source with other devices. Shown as a stereo system, the device 112 is configured to receive an analog source (e.g., from broadcasting) or retrieve a digital source (e.g., from a compact disk). The analog sources can be converted to digital sources. In certain embodiments, all audio sources, regardless of where they are located or how they are received, may be shared among the devices on the network 108.

Any device on the network 108 may be configured to control operations of playback devices, such as the zone players 102, 104 and 106. In particular, one or more controlling devices 140 and 142 are used to control zone players 102, 104 and 106 as shown in FIG. 1. The controlling devices 140 and 142 may be portable, for example. The controlling devices 140 and 142 may remotely control the zone players via a wireless data communication interface (e.g., infrared, radio, wireless standard IEEE 802.11b or 802.11g, etc.). In an embodiment, besides controlling an individual zone player, the controlling device 140 or 142 is configured to manage audio sources and other characteristics of all the zone players regardless where the controlling device 140 or 142 is located in a house or a confined complex.

In certain embodiments, a playback device may communicate with and/or control other playback devices. For example, one zone player may provide data to one or more other zone players. A zone player may serve as a master device in one configuration and a slave device in another configuration, for example.

Also shown is a computing device 144 provided to communicate with one or all of the devices on the network 108. The computing device 144 may be a desktop computer, a laptop computer, a tablet, a smart phone or any computing device with a display screen. According to an embodiment, each of the networked devices on the network 108 has an IP address. The computing device 144 is used by a user to access one or all of the zone players to adjust a sound profile. Depending on implementation, the sound profile includes various filters, frequencies, equalizers, gains or other factors that may affect a listening experience.

Figure 2A:
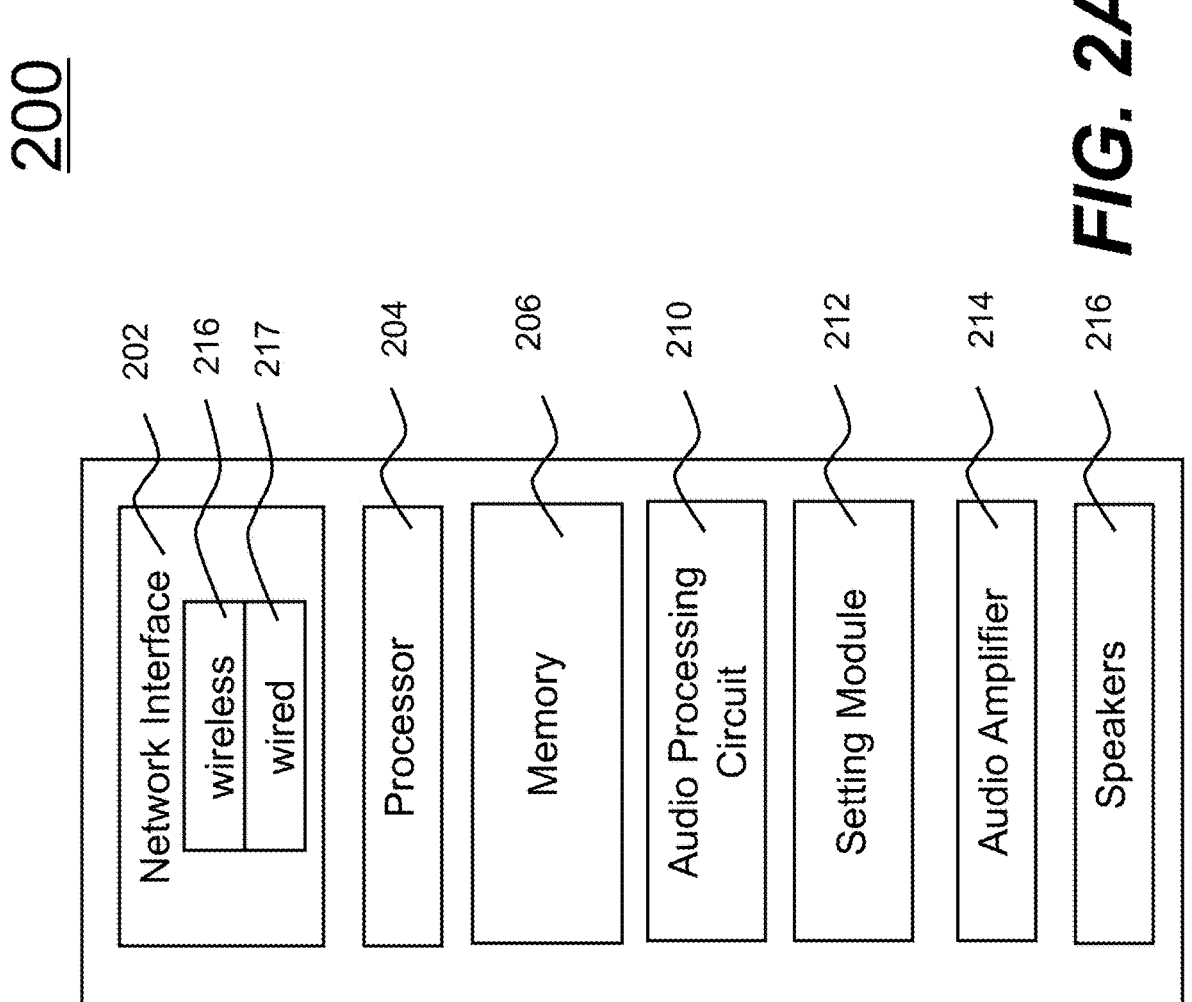
FIG. 2A shows an example functional block diagram of a player in accordance with certain embodiments.

Referring now to FIG. 2A, there is shown an example functional block diagram of a playback device, such as a zone player 200. The zone player 200 includes a network interface 202, a processor 204, a memory 206, an audio processing circuit 210, a setting module 212, an audio amplifier 214 and a set of speakers. The network interface 202 facilitates a data flow between a data network (e.g., the data network 108 of FIG. 1) and the zone player 200 and typically executes a special set of rules (e.g., a protocol) to send data back and forth. One example protocol is TCP/IP (Transmission Control Protocol/Internet Protocol) commonly used in the Internet. In general, a network interface manages the assembling of an audio source or file into smaller packets that are transmitted over the data network or reassembles received packets into the original source or file. In addition, the network interface 202 handles the address part of each packet so that it gets to the right destination or intercepts packets destined for the zone player 200.

In the example of FIG. 2A, the network interface 202 may include either one or both of a wireless interface 216 and a wired interface 217. The wireless interface 216, such as a radiofrequency (RF) interface, provides network interface functions wirelessly for the zone player 200 to communicate with other devices in accordance with a communication protocol (such as the wireless standard IEEE 802.11a, 802.11b or 802.11g). The wired interface 217 provides network interface functions by a wired connection (e.g., an Ethernet cable). In an embodiment, a zone player, referred to as an access zone player, includes both of the interfaces 216 and 217, and other zone players include only the RF interface 216. Thus these other zone players communicate with other devices on a network or retrieve audio sources via the access zone player. The processor 204 is configured to control the operation of other parts in the zone player 200. The memory 206 may be loaded with one or more software modules that can be executed by the processor 204 to achieve desired tasks.

In the example of FIG. 2A, the audio processing circuit 210 resembles most of the circuitry in an audio playback device and includes one or more digital-to-analog converters (DAC), an audio preprocessing part, an audio enhancement part or a digital signal processor and others. In operation, when an audio source (e.g., audio source) is retrieved via the network interface 202, the audio source is processed in the audio processing circuit 210 to produce analog audio signals. The processed analog audio signals are then provided to the audio amplifier 214 for playback on speakers. In addition, the audio processing circuit 210 may include necessary circuitry to process analog signals as inputs to produce digital signals for sharing with other devices on a network.

Depending on an exact implementation, the setting module 212 may be implemented within the audio processing circuit 210 or as a combination of hardware and software. The setting module 212 is provided to access different sound profiles stored in the memory 206 of the zone player and work with the audio processing circuit 210 to effectuate the sound quality or sound experience.

In the example of FIG. 2A, the audio amplifier 214 includes an analog circuit that powers the provided analog audio signals to drive one or more speakers 216. In an embodiment, the amplifier 214 is automatically powered off when there is no incoming data packets representing an audio source or powered on when the zone player is configured to detect the presence of the data packets.

In the example of FIG. 2A, the speakers 216 may be in different configurations. For example, the speakers may be a configuration of:

1) 2-channel: the stereo audio player is connected to two speakers: left and right speakers to form a stereo sound;

2) 3-channel (or 2.1 sound effects): the stereo audio player is connected to three speakers: left and right speakers and a subwoofer to form a stereo sound; and 3) 6-channel (or 5.1 sound effects): the stereo audio player is connected to five speakers: front left, front right, center, rear left and rear right speakers and a subwoofer to form a surrounding sound.

Unless specifically stated herein, a device being adjusted includes one or more speakers. When a profile is determined, a sound may be produced collectively from the speakers, from one of the speakers, and so on.

Referring now to FIG. 213, there is shown an example of a controller 240, which may correspond to the controlling device 140 or 142 of FIG. 1. The controller 240 may be used to facilitate the control of multi-media applications, automation and others in a living complex. In particular, the controller 240 is configured to facilitate a selection of a plurality of audio sources available on the network, controlling operations of one or more zone players (e.g., the zone player 200) through a RF interface corresponding to the wireless interface 216 of FIG. 2A. According to one embodiment, the wireless interface is based on an industry standard (e.g., infrared, radio, wireless standard IEEE 802.11a, 802.11b or 802.11g). When a particular audio source is being played in the zone player 200, a picture, if there is any, associated with the audio source may be transmitted from the zone player 200 to the controller 240 for display. In an embodiment, the controller 240 is used to select an audio source for playback. In another embodiment, the controller 240 is used to manage (e.g., add, delete, move, save, or modify) a playlist.

In the example of FIG. 213, the user interface for the controller 240 includes a screen 242 (e.g., a LCD screen) and a set of functional buttons as follows: a "zones" button 244, a "back" button 246, a "music" button 248, a scroll wheel 250, "ok" button 252, a set of transport control buttons 254, a mute button 262, a volume up/down button 264, a set of soft buttons 266 corresponding to the labels 268 displayed on the screen 242.

Figure 2B:
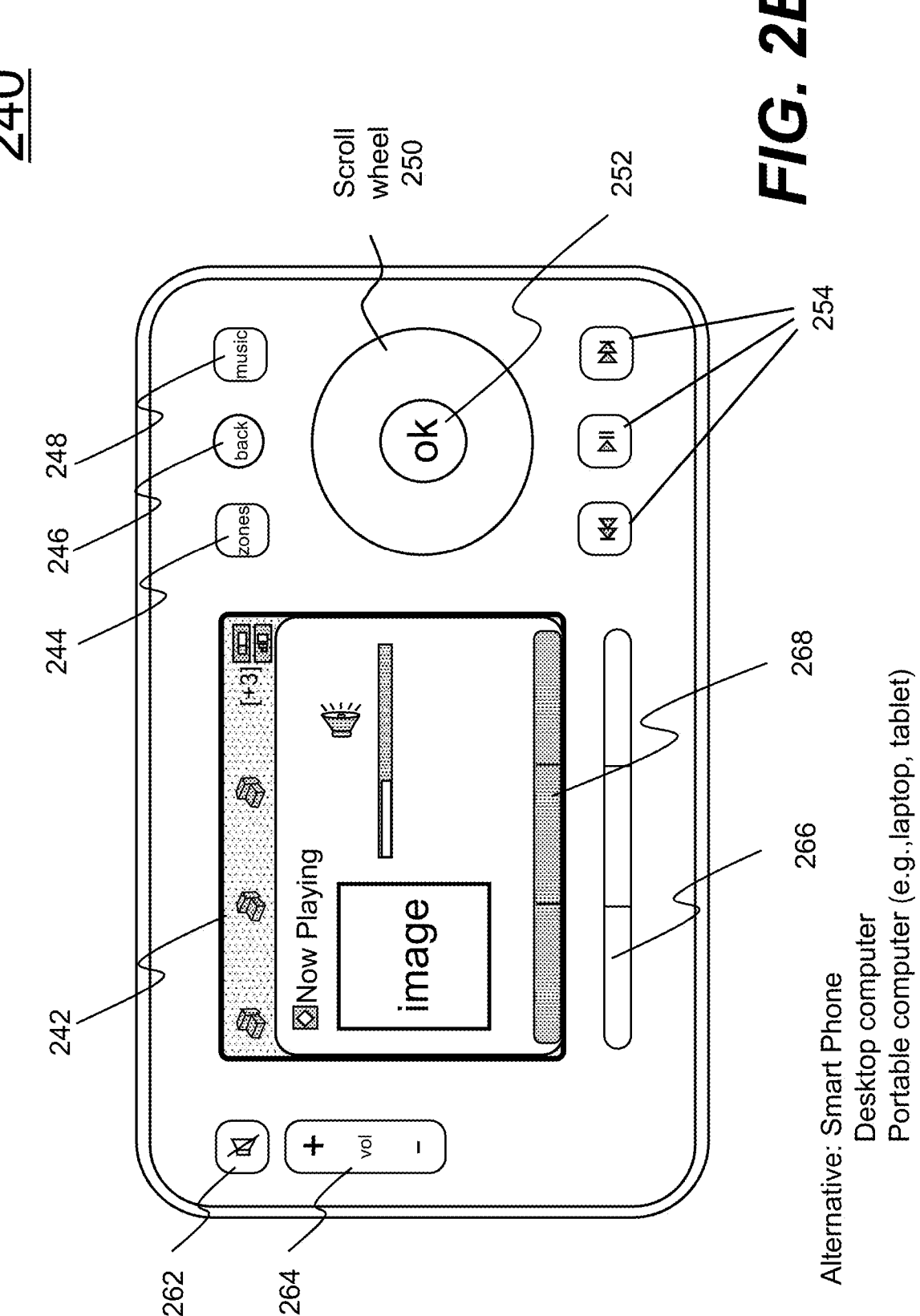
FIG. 2B shows an example of controllers that may be used to remotely control one of more players of FIG. 1.

In the example of FIG. 2B, the screen 242 displays various screen menus in response to a selection by a user. In an embodiment, the "zones" button 244 activates a zone management screen or "Zone Menu" to allow a user to group players in a number of desired zones so that the players are synchronized to play an identical playlist or tracks. The "back" button 246 may lead to different actions depending on the current screen. In an embodiment, the "back" button triggers the current screen display to go back to a previous one. In another embodiment, the "back" button negates the user's erroneous selection. The "music" button 248 activates a music menu, which allows the selection of an audio source (e.g., a song track) to be added to a playlist (e.g., a music queue) for playback.

In the example of FIG. 2B, the scroll wheel 250 is used for selecting an item within a list, whenever a list is presented on the screen 242. When the items in the list are too many to be accommodated in one screen display, a scroll indicator such as a scroll bar or a scroll arrow is displayed beside the list. When the scroll indicator is displayed, a user may rotate the scroll wheel 250 to either choose a displayed item or display a hidden item in the list. The "ok" button 252 is use to confirm the user selection on the screen 242 or activate a playback of an item.

In the example of FIG. 2B, there are three transport buttons 254, which are used to control the effect of the currently playing track. For example, the functions of the transport buttons may include play/pause and forward/rewind a track, move forward to the next track, or move backward to the previous track. According to an embodiment, pressing one of the volume control buttons such as the mute button 262 or the volume up/down button 264 activates a volume panel. In addition, there are three soft buttons 266 that can be activated in accordance with the labels 268 on the screen 242. It can be understood that, in a multi-zone system, there may be multiple audio sources being played respectively in more than one zone players. The music transport functions described herein shall apply selectively to one of the sources when a corresponding zone player is selected.

Figure 2C:
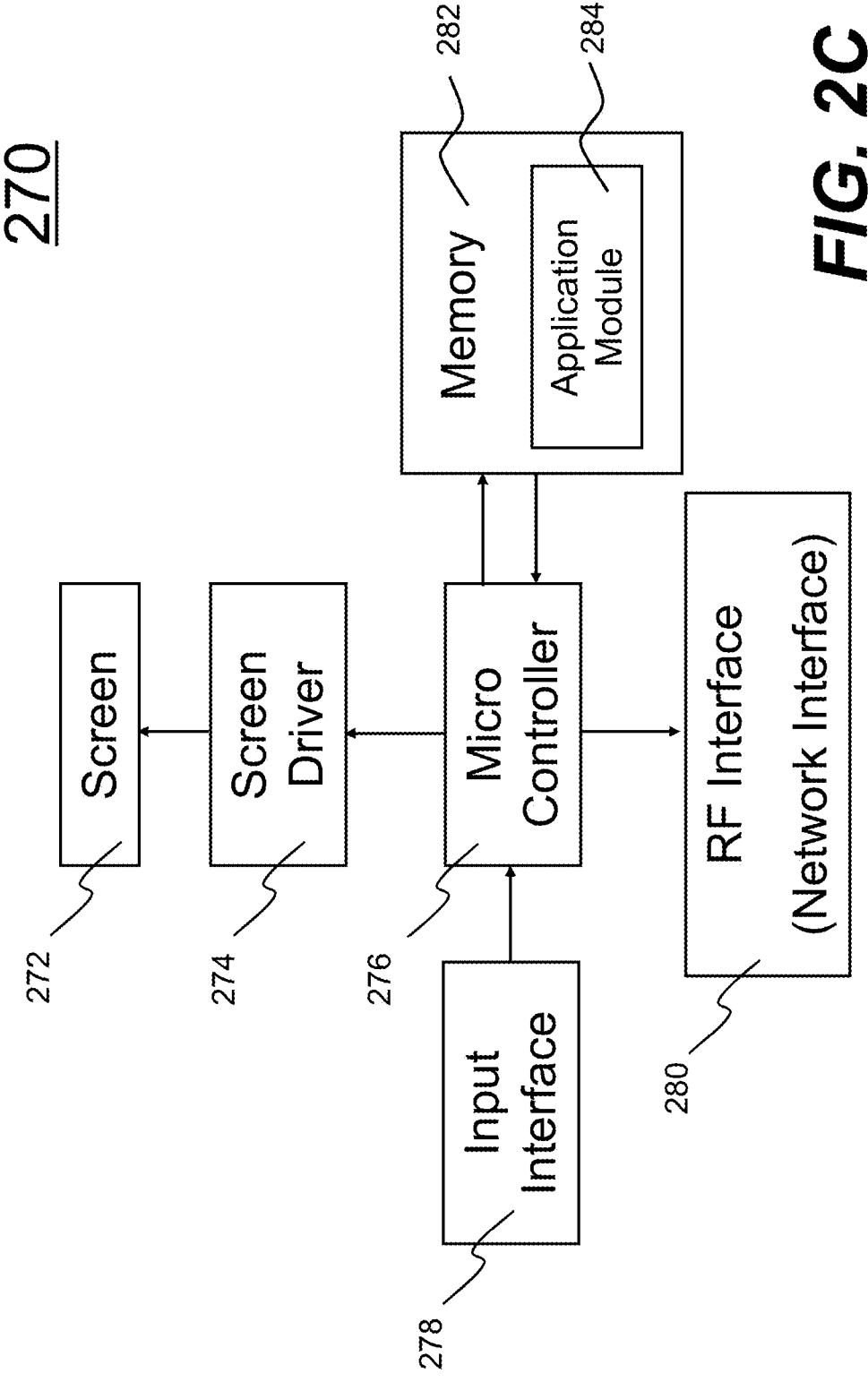
FIG. 2C shows an example internal functional block diagram of a controller in accordance with certain embodiments.

FIG. 2C illustrates an internal functional block diagram of an example controller 270, which may correspond to the controller 240 of FIG. 213. The screen 272 on the controller 270 may be a LCD screen. The screen 272 communicates with and is commanded by a screen driver 274 that is controlled by a microcontroller (e.g., a processor) 276. The memory 282 may be loaded with one or more application modules 284 that can be executed by the microcontroller 276 with or without a user input via the user interface 278 to achieve desired tasks.

In an embodiment, an application module is configured to facilitate other control functions for the zone players, for example, to initiate a downloading command to receive a sound profile from another user or a speaker system. For example, a first user wants to share with a second user his sound profile created specifically for a type of jazz music. The second user can use the controller 270 to access the system (e.g., the system in FIG. 1) of the first user to receive the profile, provided the first user allows. The received profile can be saved and put into effect in the system being used by the second user. As a result, both systems of the first and second users produce substantially similar sound effects when a jazz music is played back.

In operation, when the microcontroller 276 executes one of the application modules 284, the screen driver 274 generates control signals to drive screen 272 to display an application specific user interface accordingly, more of which will be described below.

In the example of FIG. 2C, the controller 270 includes a network interface 280 referred to as a RF interface 280 that facilitates wireless communication with a zone player via a corresponding wireless interface or RF interface thereof. The controller 270 may control one or more zone players, such as 102, 104 and 106 of FIG. 1. Nevertheless, there may be more than one controllers, each preferably in a zone (e.g., a room) and configured to control any one and all of the zone players.

It should be pointed out that the controller 240 in FIG. 2B is not the only controlling device that may practice certain embodiments. Other devices that provide the equivalent control functions (e.g., a computing device, a PDA, a hand-held device, and a laptop computer, etc.) may also be configured to practice certain embodiments. In the above description, unless otherwise specifically described, keys or buttons are generally referred to as either the physical buttons or soft buttons, enabling a user to enter a command or data.

Figure 3:
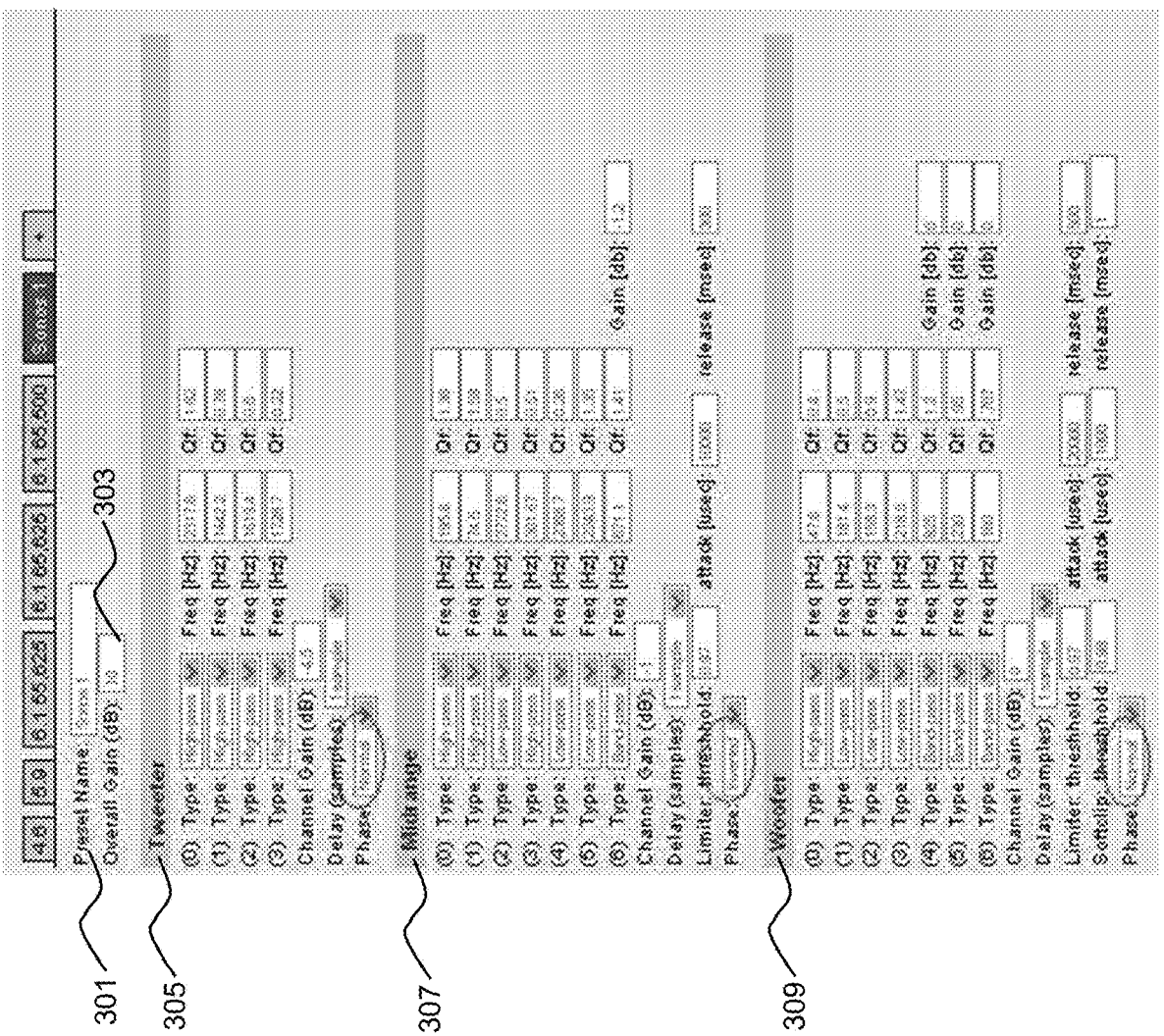
FIG. 3 shows an example interface in an embodiment to allow a user to graphically adjust various settings via a network.

FIG. 3 shows an example interface 300 for a user to create, adjust or update a sound profile. When the profile 300 is saved, various parameters in the profile 301 are updated. When the profile 300 is selected, the parameters are put into use and cause an audio signal to be processed accordingly (e.g., to band-pass certain frequencies). In certain embodiments, a profile 300 may be selected from a plurality of profiles via a controller. In certain embodiments, a profile 300 may be sent from one user or system to another user or system to configure one or more speakers at the receiving system. In certain embodiments, a profile 300 may be requested by a user or system.

As illustrated in the example of FIG. 3, the profile 300 may include a preset name or reference 301, an overall gain 303 (e.g., in decibels (dB)), and one or more speaker component settings 305, 307, 309 (e.g., tweeter, midrange, woofer, and so on). For each component, one or more parameters (e.g., type, frequency (e.g., Hertz), quality factor, channel gain (e.g., dB), delay (e.g., samples), phase, limiter, (e.g., threshold, attack (e.g., microseconds), release (e.g., milliseconds), etc.), softclip (e.g., threshold, attack (e.g., microseconds), release (e.g., milliseconds), etc.), and so on, may be specified. Thus, using the example interface of FIG. 3, one or more parameters for one or more settings of a speaker profile 300 may be set. In certain embodiments, the profile 300 may be initialized with factory or default values and modified by a user, software program, and so on via the interface.

Figure 4:
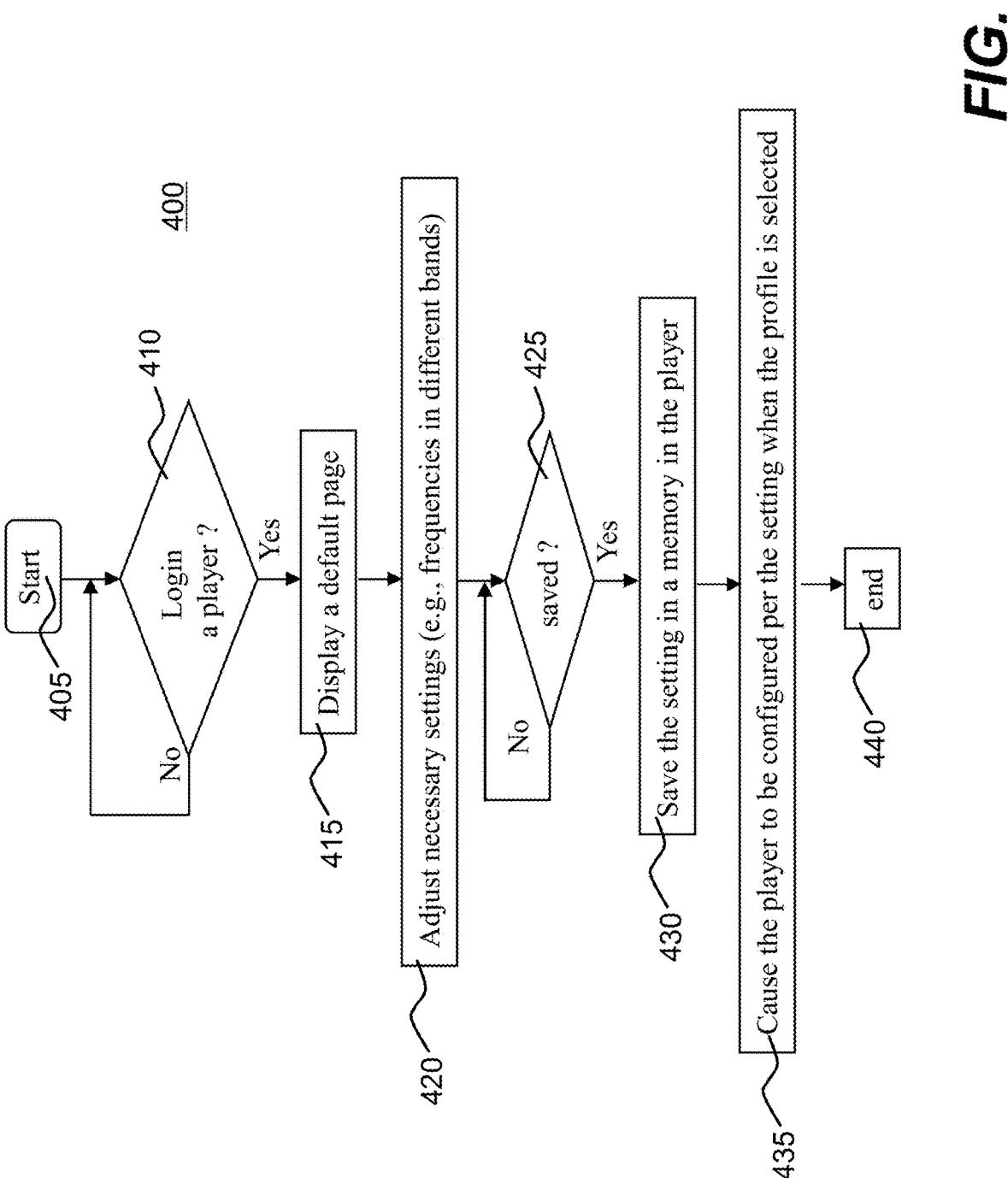
FIG. 4 shows a flowchart or process of adjusting various settings in a speaker system.

FIG. 4 shows a flowchart or process 400 of adjusting a profile to be used in a networked audio device. At block 405, the process 400 begins. At block 410, it is determined whether a playback device is to be logged in. If yes, at block 415, a default page is displayed. If no, then the process 400 continues to check for a playback device (e.g., zone player) to be logged in to the configuration system.

At block 420, one or more settings are adjusted (e.g., frequencies in different bands, and so on). At block 425, it is determined whether the setting(s) are to be saved at the device. If not, the process 400 continues to adjust settings until a desired configuration of settings is reached. If so, at block 430, the setting(s) are saved in a memory in the playback device. Settings may be associated with a name or other identifier (e.g., "Jazz", "Rock" "Radio", and so on). Saved settings may form a speaker profile, for example. Settings may be shared with another, remotely located speaker system via the profile, for example.

At block 435, the playback device is configured based on the setting(s). For example, a profile and/or other stored settings may be selected to configure the playback device accordingly. At block 440, after the playback device is configured, the process 400 ends. The playback device may then be used to playback multimedia content, for example. In certain embodiments, the playback device may be configured or re-configured based on profile settings while multimedia content is being played back.

Figure 5:
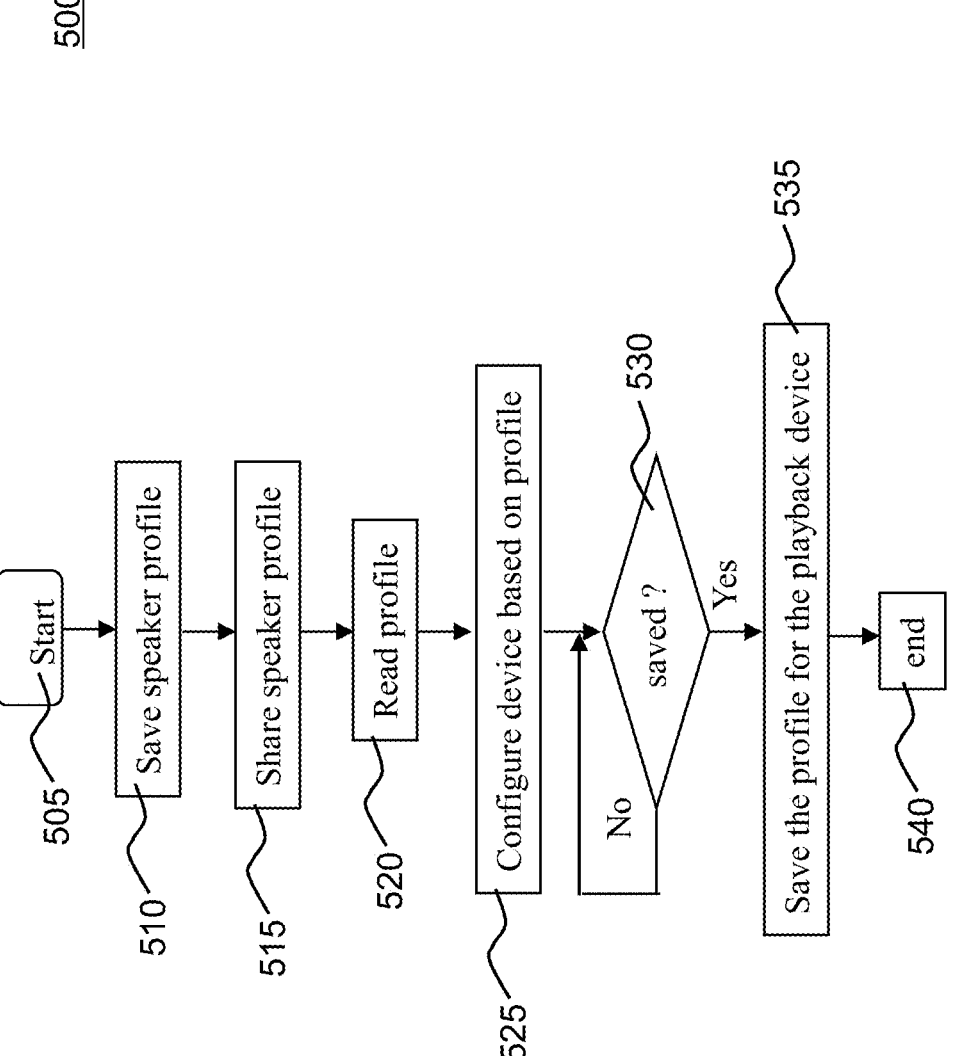
FIG. 5 shows a flowchart or process of sharing a profile between two remotely separated sound systems.
Figure 5:

FIG. 5 shows a flowchart or process of sharing a profile between two remotely separated sound systems. At block 505, the process 500 begins. At block 510, a speaker profile is saved. For example, a Joe's Jazz Profile" sound profile for a playback device or other speaker is configured and saved by a user via an interface, such as the example profile interface 300 of FIG. 3. At block 515, the profile is shared. The profile may be shared with another user, another device, and so on. For example, a copy of the profile may be sent to a user, device, and so on. Alternatively, a link to the profile may be sent to a user, device, and so on.

At block 520, the profile is read. For example, the profile is accessed by a playback device at a location remote from a location at which the profile was created. The playback device, a controller associated with the playback device, or both the controller and the playback device read the profile. At block 525, the playback device is configured based on setting(s) in the profile. For example, a profile and/or other stored settings may be selected to configure the playback device accordingly.

At block 530, it is determined whether the profile is to be saved at the playback device. If so, at block 535, the profile is saved at the playback device. At block 540, after the playback device is configured, the process 500 ends. The playback device may then be used to playback multimedia content, for example. In certain embodiments, the playback device may be configured or re-configured based on profile settings while multimedia content is being played back.

The processes, sequences or steps and features discussed above and in the appendix are related to each other and each is believed independently novel in the art. The disclosed processes and sequences may be performed alone or in any combination to provide a novel and unobvious system or a portion of a system. It should be understood that the processes and sequences in combination yield an equally independently novel combination as well, even if combined in their broadest sense (e.g., with less than the specific manner in which each of the processes or sequences has been reduced to practice in the disclosure herein).

The forgoing and attached are illustrative of various aspects/embodiments of the present invention, the disclosure of specific sequence/steps and the inclusion of specifies with regard to broader methods and systems are not intended to limit the scope of the invention which finds itself in the various permutations of the features disclosed and described herein as conveyed to one of skill in the art.

The invention claimed is:

1. A playback device comprising: one or more processors; one or more communications interfaces; and tangible, non-transitory computer-readable media comprising program instructions executable by the one or more processors such that the playback device is configured to:

receive a first sound profile separate from an audio content file, wherein the first sound profile is (i) a previously created sound profile that is specific to a first type of audio content, and (ii) received via the one or more communications interfaces from a first networked device operating outside of a first local area network on which the playback device is operating, wherein the first sound profile comprises a first set of audio playback equalization settings for use when playing the first type of audio content;

receive a second sound profile separate from an audio content file, wherein the second sound profile is (i) a previously created sound profile that is specific to a second type of audio content, and (ii) received via the one or more communications interfaces from a second networked device operating outside of the first local area network on which the playback device is operating, wherein the second sound profile comprises a second set of audio playback equalization settings for use when playing the second type of audio content;

play the first type of audio content according to the first sound profile; and play the second type of audio content according to the second sound profile.

2. The playback device of claim 1, wherein:

the first set of audio playback equalization settings defined in the first sound profile comprises at least one of a band, frequency, equalizer, or gain; and the second set of audio playback equalization settings defined in the second sound profile comprises at least one of a band, frequency, equalizer, or gain.

3. The playback device of claim 1, wherein:

the first set of audio playback equalization settings defined in the first sound profile comprises at least one of a quality factor, delay, phase, limiter, softclip, or release; and the second set of audio playback equalization settings defined in the second sound profile comprises at least one of a quality factor, delay, phase, limiter, softclip, or release.

4. The playback device of claim 1, wherein the tangible, non-transitory computer-readable media further comprises program instructions that are executable by the one or more processors such that the playback device is configured to save both the first sound profile and the second sound profile in the tangible, non-transitory computer-readable media.

5. The playback device of claim 1, wherein the program instructions further comprise instructions executable by the one or more processors such that the playback device is configured to adjust one or both of the first sound profile or the second sound profile based on one or more commands received from a controller device separate from the playback device and operating on the first local area network.

6. The playback device of claim 1, wherein at least one of the first networked device or the second networked device comprises another playback device configured to operate on a second local area network that is separate from the first local area network.

7. The playback device of claim 1, wherein at least one of the first networked device or the second networked device comprises one of a desktop computer, a laptop computer, a tablet, or a smart phone.

8. The playback device of claim 1, wherein the first sound profile is received via the one or more communications interfaces from the first networked device via the Internet.

9. The playback device of claim 1, wherein the program instructions comprise program instructions executable by the one or more processors such that the playback device is further configured to:

via the one or more communications interfaces, transmit at least one of the first sound profile or the second sound profile to a second playback device operating on the first local area network; and wherein the program instructions executable by the one or more processors such that the playback device is configured to play the first type of audio content according to the first sound profile comprise program instructions executable by the one or more processors such that the playback device is configured to play the first type of audio content according to the first sound profile in a synchronized manner with the second playback device playing the first type of audio content according to the first sound profile; and wherein the program instructions executable by the one or more processors such that the playback device is configured to play the second type of audio content according to the second sound profile comprise program instructions executable by the one or more processors such that the playback device is configured to play the second type of audio content according to the second sound profile in a synchronized manner with the second playback device playing the second type of audio content according to the second sound profile.

10. Tangible, non-transitory computer readable media comprising program instructions, wherein the program instructions, when executed by one or more processors, cause a playback device to perform functions comprising:

receiving a first sound profile separate from an audio content file via one or more communications interfaces of the playback device, wherein the first sound profile is (i) a previously created sound profile that is specific to a first type of audio content, and (ii) received via the one or more communications interfaces from a first networked device operating outside of a first local area network on which the playback device is operating, wherein the first sound profile comprises a first set of audio playback equalization settings for use when playing the first type of audio content;

receiving a second sound profile separate from an audio content file via the one or more communications interfaces of the playback device, wherein the second sound profile is (i) a previously created sound profile that is specific to a second type of audio content, and (ii) received via the one or more communications interfaces from a second networked device operating outside of the first local area network on which the playback device is operating, wherein the second sound profile comprises a second set of audio playback equalization settings for use when playing the second type of audio content;

playing the first type of audio content according to the first sound profile; and playing the second type of audio content according to the second sound profile.

11. The tangible, non-transitory computer readable media of claim 10, wherein:

the first set of audio playback equalization settings defined in the first sound profile comprises at least one of a band, frequency, equalizer, or gain; and the second set of audio playback equalization settings defined in the second sound profile comprises at least one of a band, frequency, equalizer, or gain.

12. The tangible, non-transitory computer readable media of claim 10, wherein:

the first set of audio playback equalization settings defined in the first sound profile comprises at least one of a quality factor, delay, phase, limiter, softclip, or release; and the second set of audio playback equalization settings defined in the second sound profile comprises at least one of a quality factor, delay, phase, limiter, softclip, or release.

13. The tangible, non-transitory computer readable media of claim 10, wherein the functions further comprise:

saving both the first sound profile and the second sound profile at the playback device.

14. The tangible, non-transitory computer readable media of claim 10, wherein the functions further comprise:

adjusting one or both of the first sound profile or the second sound profile based on one or more commands received from a controller device separate from the playback device and operating on the first local area network.

15. The tangible, non-transitory computer readable media of claim 10, wherein at least one of the first networked device or the second networked device comprises another playback device configured to operate on a second local area network that is separate from the first local area network.

16. The tangible, non-transitory computer readable media of claim 10, wherein at least one of the first networked device or the second networked device comprises one of a desktop computer, a laptop computer, a tablet, or a smart phone.

17. The tangible, non-transitory computer readable media of claim 10, wherein the first sound profile is received via the one or more communications interfaces from the first networked device via the Internet.

18. The tangible, non-transitory computer readable media of claim 10, wherein the functions further comprise:

transmitting at least one of the first sound profile or the second sound profile via the one or more communications interfaces to a second playback device operating on the first local area network;

wherein playing the first type of audio content according to the first sound profile comprises playing the first type of audio content according to the first sound profile in a synchronized manner with the second playback device playing the first type of audio content according to the first sound profile; and wherein playing the second type of audio content according to the second sound profile comprises playing the second type of audio content according to the second sound profile in a synchronized manner with the second playback device playing the second type of audio content according to the second sound profile.

19. A method performed by a first playback device, the method comprising:

receiving a first sound profile separate from an audio content file via one or more communications interfaces of the first playback device, wherein the first sound profile is (i) a previously created sound profile that is specific to a first type of audio content, and (ii) received via the one or more communications interfaces from a first networked device operating outside of a first local area network on which the first playback device is operating, wherein the first sound profile comprises a first set of audio playback equalization settings for use when playing the first type of audio content, and wherein the first set of audio playback equalization settings defined in the first sound profile comprises at least one of a band, a frequency, an equalizer, a gain, a quality factor, a delay, a phase, a limiter, a softclip, or a release;

receiving a second sound profile separate from an audio content file via the one or more communications interfaces of the first playback device, wherein the second sound profile is (i) a previously created sound profile that is specific to a second type of audio content, and (ii) received via the one or more communications interfaces from a second networked device operating outside of the first local area network on which the first playback device is operating, wherein the second sound profile comprises a second set of audio playback equalization settings for use when playing the second type of audio content, and wherein the second set of audio playback equalization settings defined in the second sound profile comprises at least one of a band, a frequency, an equalizer, a gain, a quality factor, a delay, a phase, a limiter, a softclip, or a release;

playing the first type of audio content according to the first sound profile; and playing the second type of audio content according to the second sound profile;

transmitting at least one of the first sound profile or the second sound profile via the one or more communications interfaces to a second playback device operating on the first local area network;

wherein playing the first type of audio content according to the first sound profile comprises playing the first type of audio content according to the first sound profile in 5 a synchronized manner with the second playback device playing the first type of audio content according to the first sound profile; and wherein playing the second type of audio content according to the second sound profile comprises playing the 10 second type of audio content according to the second sound profile in a synchronized manner with the second playback device playing the second type of audio content according to the second sound profile.

20. The method of claim 19, further comprising: 15 transmitting at least one of the first sound profile or the second sound profile via the one or more communications interfaces to a second playback device operating on the first local area network;

wherein playing the first type of audio content according 20 to the first sound profile comprises playing the first type of audio content according to the first sound profile in a synchronized manner with the second playback device playing the first type of audio content according to the first sound profile; and 25 wherein playing the second type of audio content according to the second sound profile comprises playing the second type of audio content according to the second sound profile in a synchronized manner with the second playback device playing the second type of audio 30 content according to the second sound profile.

* * * * *